(12) United States Patent
Zang et al.

(10) Patent No.: US 10,446,654 B1
(45) Date of Patent: Oct. 15, 2019

(54) GATE CONTACT STRUCTURES AND SELF-ALIGNED CONTACT PROCESS

(71) Applicant: GLOBALFOUNDRIES INC., Grand Cayman (KY)

(72) Inventors: Hui Zang, Guilderland, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/008,711

(22) Filed: Jun. 14, 2018

(51) Int. Cl.
*H01L 29/76* (2006.01)
*H01L 29/417* (2006.01)
*H01L 21/768* (2006.01)
*H01L 29/51* (2006.01)
*H01L 29/45* (2006.01)

(52) U.S. Cl.
CPC .. *H01L 29/41783* (2013.01); *H01L 21/76895* (2013.01); *H01L 29/456* (2013.01); *H01L 29/51* (2013.01)

(58) Field of Classification Search
CPC . H01L 29/41783; H01L 29/456; H01L 29/51; H01L 21/76895
USPC .......................................................... 257/288
See application file for complete search history.

(56) References Cited

U.S. PATENT DOCUMENTS

| 9,691,897 B2 | 6/2017 | Xie et al. | |
| 2014/0273386 A1* | 9/2014 | Tsao | H01L 29/665 438/301 |
| 2017/0103981 A1* | 4/2017 | Hung | H01L 29/785 |
| 2018/0151429 A1* | 5/2018 | Wang | H01L 21/28518 |

* cited by examiner

*Primary Examiner* — Tu-Tu V Ho
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to gate contact structures and self-aligned contact process and methods of manufacture. The structure includes: a gate structure having source and drain regions; a first metal contacting the source and drain regions; a second metal over the first metal in the source and drain regions; and a capping material over the first metal and over the gate structure.

18 Claims, 8 Drawing Sheets

GATE CONTACT STRUCTURES AND SELF-ALIGNED CONTACT PROCESS

FIELD OF THE INVENTION

The present disclosure relates to semiconductor structures and, more particularly, to gate contact structures and self-aligned contact processes.

BACKGROUND

Scaling of devices has been instrumental in the improvements in speed and power consumption of devices, e.g., transistor technologies in RF applications. Although technology has progressed significantly, such evolution (scaling) of the devices is becoming increasingly more difficult. For example, back end of the line (BEOL) and middle of the line (MOL) metallization is becoming more challenging in advanced technology nodes due to the critical dimension (CD) scaling and process capabilities.

These challenges include the difficulty in controlling etching processes. For example, it has been observed in conventional device fabrication processes that the etching process can result in a punch through effect; that is, an etching process for a gate contact can attack insulator material and expose the source/drain regions or contacts of the source drain contacts (and vice versa). Due to this exposure, the metallization for the gate contact can land on both the gate metal and the source/drain silicide or contact regions.

SUMMARY

In an aspect of the disclosure, a structure comprises: a gate structure having source and drain regions; a first metal material contacting the source and drain regions; a second metal material over the first metal material in the source and drain regions; and a capping material over the first metal material and over the gate structure.

In an aspect of the disclosure, a structure comprises: source and drain regions of a gate structure comprising a first metal material and a second metal material; the gate structure comprising a metal gate material and the second metal material in contact with the metal gate material; a capping material over selected portions of the first metal material of the source drain regions and the metal gate material; and metal contacts contacting the second metal material in the source and drain regions and over the gate structure.

In an aspect of the disclosure, a method comprises: forming a first metal material over source and drain regions of a gate structure; forming a second metal material over the first metal material and over a gate metal of the gate structure; forming a capping material over selected portions of the first metal material of the source drain regions and the metal gate material; and forming metal contacts contacting the second metal material in the source and drain regions and over gate metal of the gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to gate contact structures and self-aligned contact processes. More specifically, the present disclosure provides a gate contact scheme for middle of the line (MOL) structures with two different metallization features over the source/drain regions. Advantageously, by implementing the present disclosure it is now possible to scale devices while avoiding shorting issues between gate contacts and source/drain regions.

In embodiments, the structure includes two different metals over the source and drain regions of a gate structure. A contact for the source and drain regions will land on the second metal. In addition, the structure includes a capping material over the first metal and selected portions of the gate structure. The method of forming the self-aligned contact structure generally includes the following steps (which are described in greater detail below): forming a first source/drain metallization over the source/drain region; removing a gate cap over the gate region; forming a second source/drain metallization over the source/drain region (which will also be over the gate metal); recessing exposed portions of the first source/drain metallization; forming a dielectric cap in the recess; and forming self-aligned contacts to both the gate metal and the second source/drain metallization.

The self-aligned gate contact structures of the present disclosure can be manufactured in a number of ways using a number of different tools. In general, though, the methodologies and tools are used to form structures with dimensions in the micrometer and nanometer scale. The methodologies, i.e., technologies, employed to manufacture the gate contact structures of the present disclosure have been adopted from integrated circuit (IC) technology. For example, the self-aligned gate contact structures are built on wafers and are realized in films of material patterned by photolithographic processes on the top of a wafer. In particular, the fabrication of the self-aligned gate contact structures uses three basic building blocks: (i) deposition of thin films of material on a substrate, (ii) applying a patterned mask on top of the films by photolithographic imaging, and (iii) etching the films selectively to the mask.

Figure 1A:
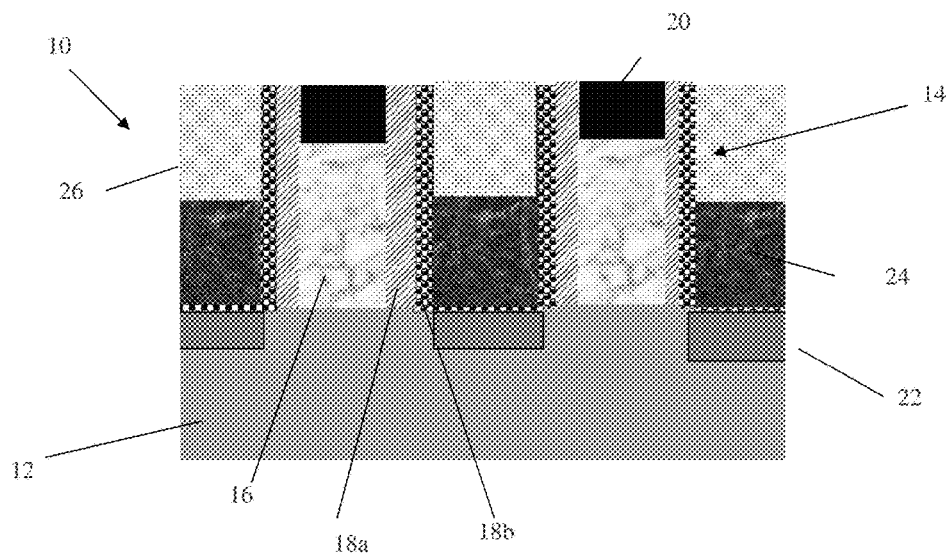
FIGS. 1A and 1B show different cross-sectional views of gate structures with source/drain regions, amongst other features, and respective fabrication processes in accordance with aspects of the present disclosure.
Figure 1B:
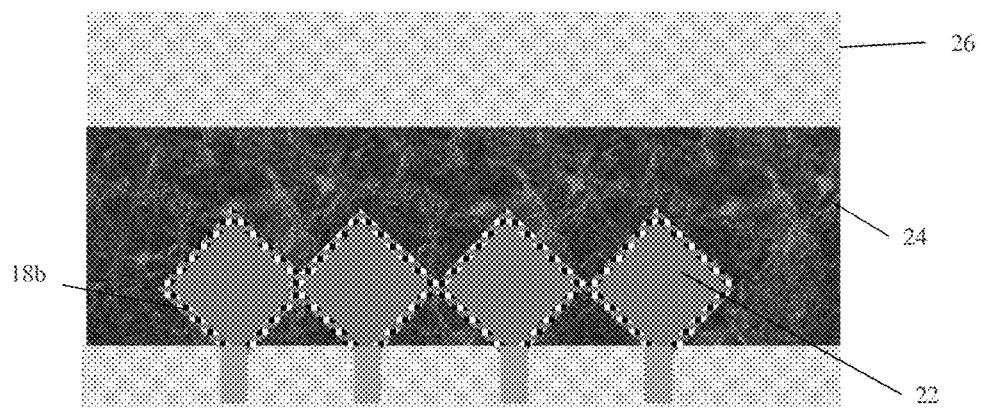

FIGS. 1A and 1B show different cross-sectional views of a replacement gate structure, amongst other features, and respective fabrication processes according to aspects of the present disclosure. The structure 10 shown in FIGS. 1A and 1B includes a substrate 12 composed of any suitable semiconductor material including, but not limited to, Si, SiGe, SiGeC, SiC, GaAs, InAs, InP, and other III/V or II/VI compound semiconductors. Replacement gate structures 14 are formed on the substrate 12 using conventional replacement gate processes such that no further explanation is required for a skilled person in the art to have a full understanding of the present disclosure.

In embodiments, the gate structures 14 include a gate dielectric material and metal material, e.g., workfunction metals, both designated at reference numeral 16. In embodiments, the gate dielectric material can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. Spacers 18a, 18b are provided on sidewalls of the gate structures 14. In embodiments, the spacer 18a can be any appropriate low-k material; whereas, the spacer 18b can be an oxide material. As this is a replacement gate structure, the spacer 18a can be deposited prior to the gate dielectric material and metal material 16. A capping material 20 can be a dielectric material, e.g., SiN, which is deposited over the metal material 16, between the spacers 18b of adjacent gate structures 14.

Still referring to FIGS. 1A and 1B, source and drain regions 22 are provided on the sides of the gate structures 14. In embodiments, the source and drain regions 22 can be raised (or planar) epitaxially grown source and drain regions, which are appropriately doped. An amorphous material 24 is formed over the source and drain regions 22. In embodiments, the amorphous material 24 can be amorphous Si, as an example. An oxide cap 26 is formed over the amorphous material 24. In embodiments, the oxide cap 26 can be deposited by a conventional deposition process, e.g., chemical vapor deposition (CVD), followed by a planarization process such as a chemical mechanical polishing (CMP) to remove any residual material on the surface of the gate structure 14.

Figure 2A:
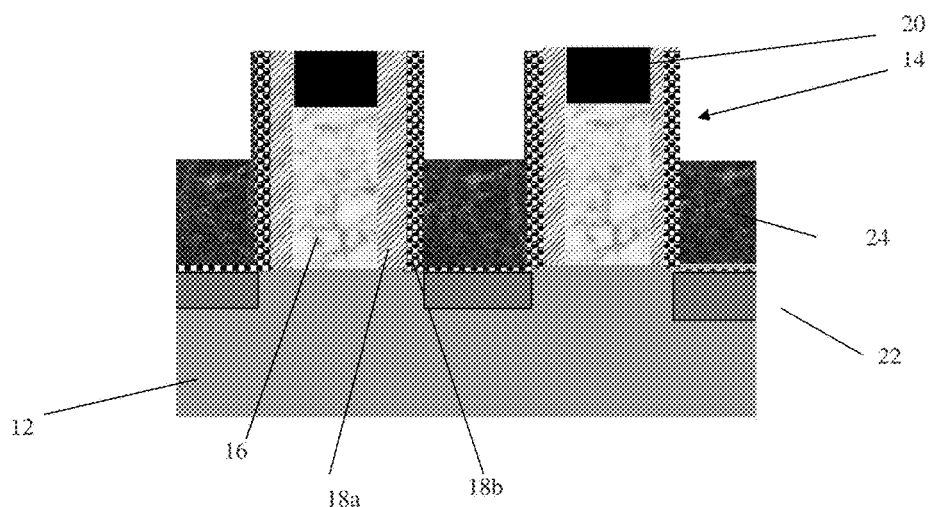
FIGS. 2A and 2B show an opening over amorphous material in the source/drain regions, amongst other features, and respective fabrication processes in accordance with aspects of the present disclosure.
Figure 2B:
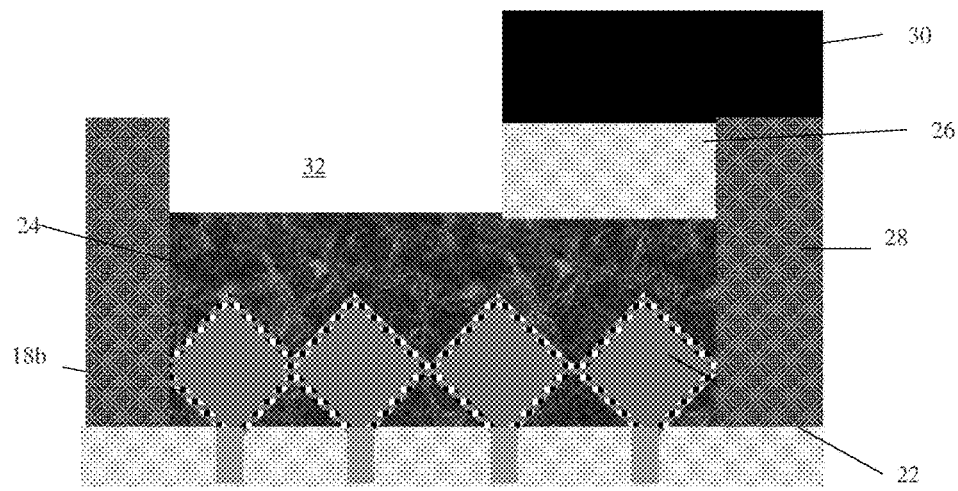

In FIGS. 2A and 2B, a source/drain cut is performed to remove any unwanted epitaxial material of the source/drain regions 22. The source/drain cut can be performed by a conventional etching process, e.g., lithography and etching process, through the amorphous material 24 and cap 26. The cut is then filled with an insulator material 28. In embodiments, the insulator material 28 can be, e.g., SiN, SiC, SiCO, etc., deposited by a conventional CVD process followed by a planarization process, e.g., CMP.

As further shown in FIGS. 2A and 2B, a portion of the oxide material 26 above the amorphous material 24 is removed by a conventional lithography and etching process. For example, as shown in FIG. 2B, a resist 30 formed over the insulator material 26 is exposed to energy (light) to form a pattern (opening). An etching process with a selective chemistry, e.g., RIE, will be used to form one or more openings (trench) 32 in the insulator material 26. The opening 32 will partially expose the underlying amorphous material 24, with the insulator material 26 providing a slight overhang over portions of the epitaxial source/drain regions 22. For example, as shown in FIG. 2B, the insulator material 26 will cover about 10% to about 50% of the amorphous material 24, and more preferably about 30% to about 40% of the amorphous material 24 (over the epitaxial source/drain regions 22). Although not shown in FIGS. 2A and 2B, the resist can then be removed by a conventional oxygen ashing process or other known stripants.

Figure 3A:
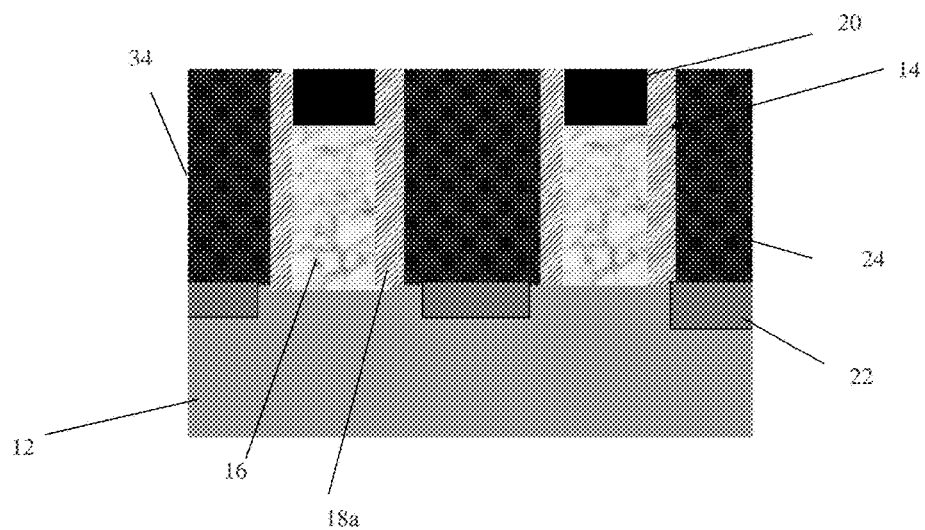
FIGS. 3A-3C show different cross-sectional views of a first metal material over the source/drain regions, amongst other features, and respective fabrication processes in accordance with aspects of the present disclosure.
Figure 3B:
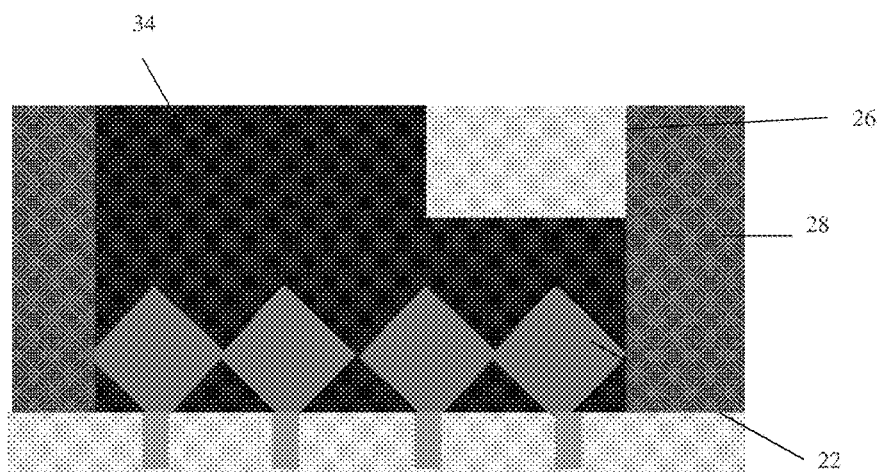
Figure 3C:
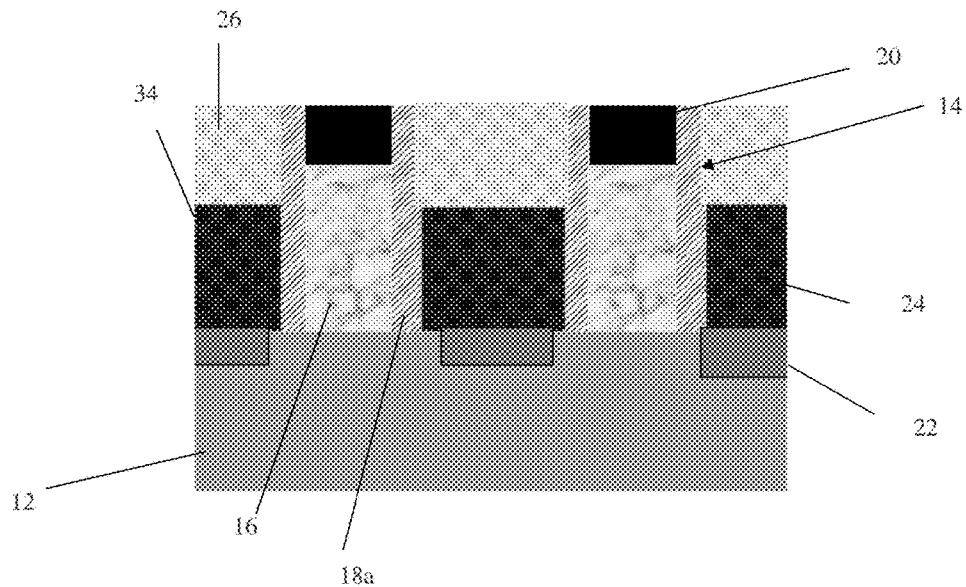

In FIGS. 3A-3C, following the resist removal, the remaining portions of the amorphous material 24 and the spacer material 18b can be removed by a wet etching process. For example, the wet etching process will remove the amorphous material 24 under the insulator material 26, exposing the epitaxial source/drain regions 22. A metal material 34 is then deposited on the epitaxial source/drain regions 22, including under the insulator material 26 (as shown in FIGS. 3B and 3C). In embodiments, the metal material 34 can be Co, Ru or W deposited by a conformal deposition process, e.g., CVD. In embodiments, the metal material 34 will be in direct contact with the epitaxial source/drain regions 22, hence forming source/drain contacts.

Figure 4A:
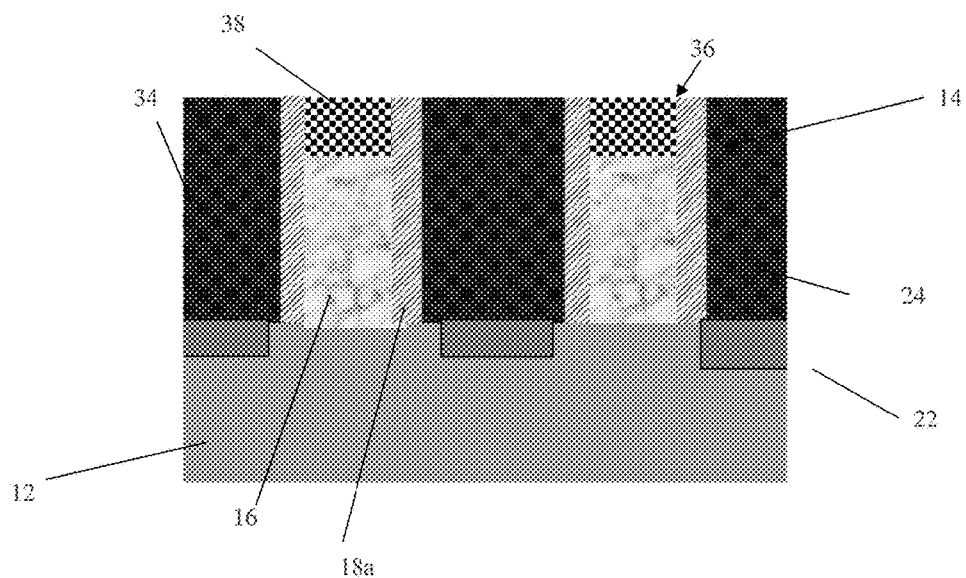
FIGS. 4A-4C show different cross-sectional views of a second metal material over the source/drain regions and over gate metal of gate structures, amongst other features, and respective fabrication processes in accordance with aspects of the present disclosure.
Figure 4B:
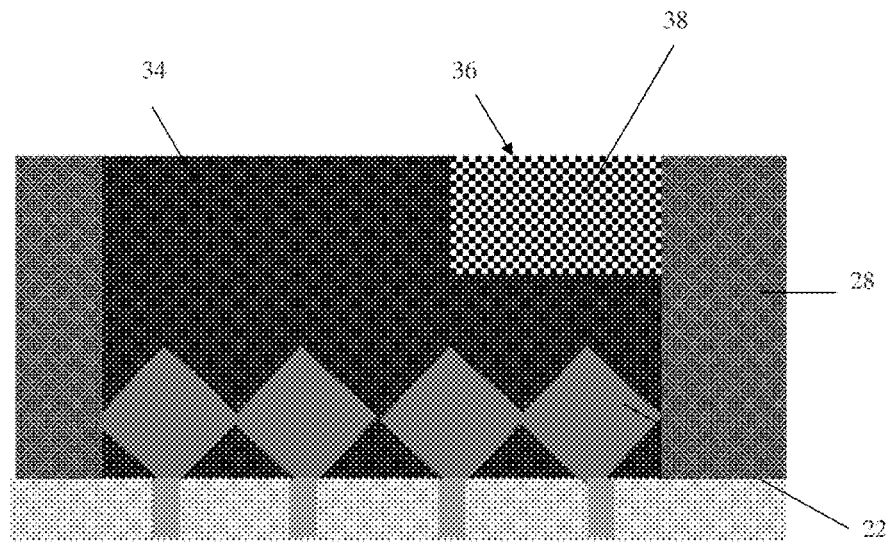
Figure 4C:
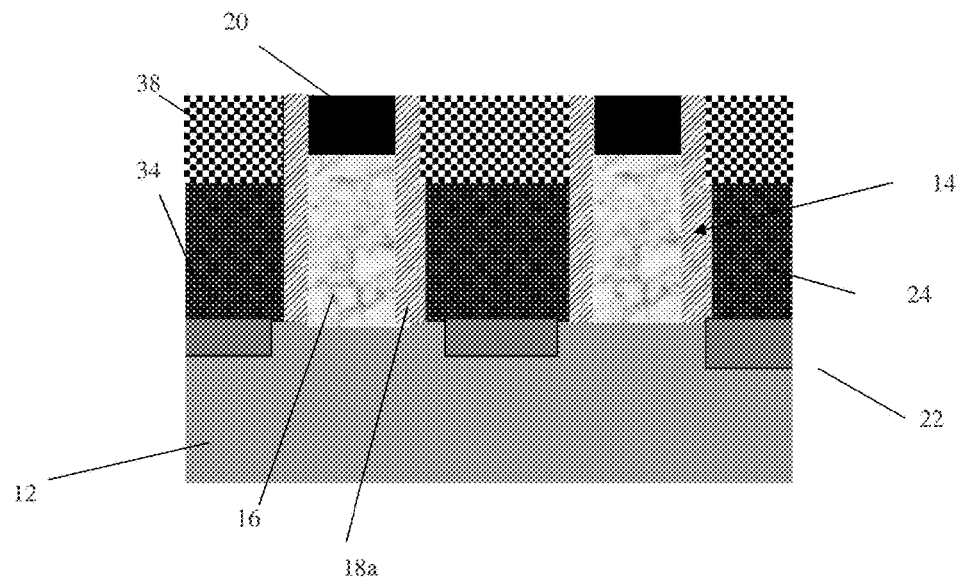

As shown in FIGS. 4A-4C, the capping material 20 over selected portions of the gate metal 16 is removed by conventional lithography and etching processes as already described herein. By way of example, as shown in the cross-sectional view of FIG. 4A, the capping material 20 is removed over selected portions of the gate metal 16; whereas, in FIG. 4C, the capping material 20 will remain over other selected portions of the gate metal 16. Accordingly, this etching process will expose the gate metal 16 of the gate structure 14 at selected areas (e.g., FIG. 4A). The insulator material 26 is also removed over the metal material 34 using, e.g., a conventional selective etch chemistry. As should be understood by those of skill in the art, the selective etching process is a maskless process. The removal of the capping material 20 and the insulator material 26 will form openings 36 (e.g., trenches), which are filled with a second type of metal material 38. Accordingly, the second type of metal material 38 will be formed over selected portions of the gate metal 16 (between capping material 20) and over the first type of metal 34 over selected portions of the source/drain regions 22.

In embodiments, the metal material 38 can be any metal material that is different than the metal material 34. For example, when the metal material 34 is Co, the metal material 38 can be Ru or W. Similarly, when the metal material 34 is Ru, the metal material 34 can be Co or W. Also, when the metal material 34 is W, the metal material 38 can be Ru or Co.

Figure 5A:
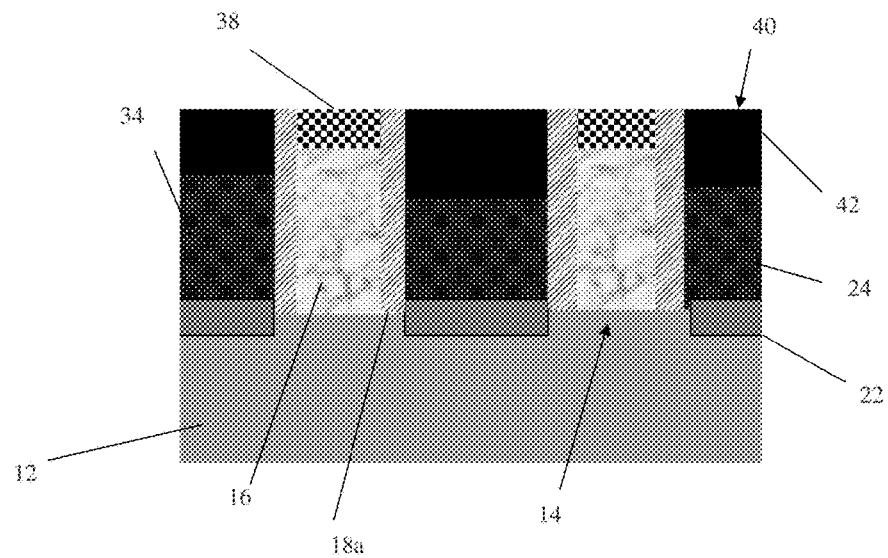
FIGS. 5A-5C show different cross-sectional views of a capping material over the first metal material, amongst other features, and respective fabrication processes in accordance with aspects of the present disclosure.
Figure 5B:
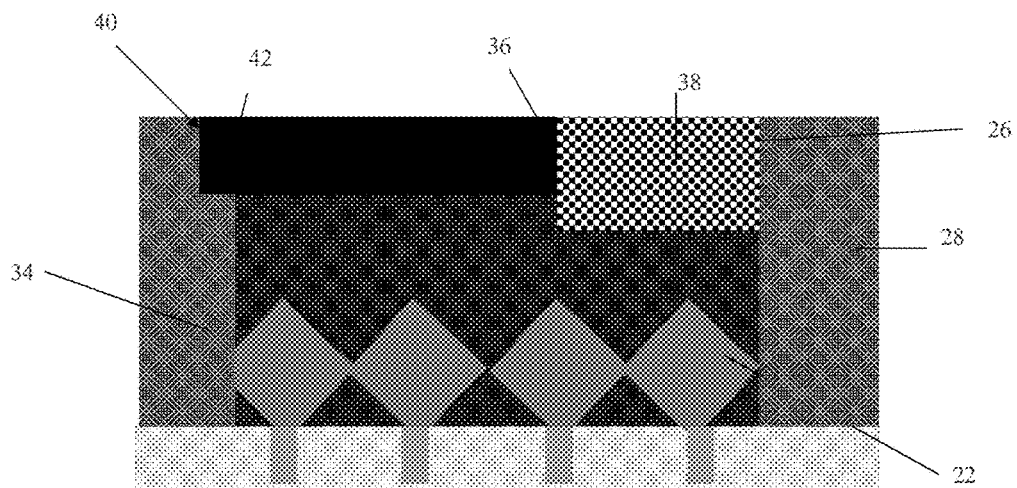
Figure 5C:
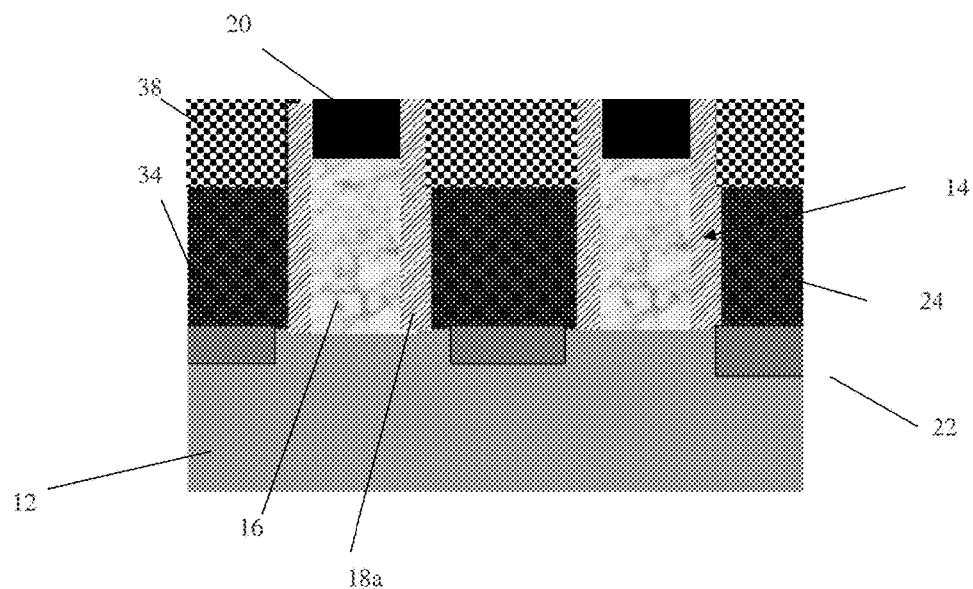

In FIGS. 5A-5C, the metal material 34 can be etched back by a selective etch chemistry to form a recess 40 over the source/drain regions 22, adjacent to the second type of metal material 38. In embodiments, the selective etch chemistry is a maskless etching process which will not attack the metal material 38 over the gate structures 14 (e.g., gate contacts). It is noted that the selective etch chemistry can be maskless due to the use of the different metal materials 34, 38.

In embodiments, the recess 40 is filled with a capping material 42, which is now over the first metal 34 and the source/drain region 22. The capping material 42 can be, e.g., SiN, deposited by a conventional deposition process, e.g., CVD. This capping material 42 will protect the metal material 34 during the gate contact formation, thereby preventing any shorting between two conductive materials. Any residual capping material on a surface of the metal material 38 can be removed by a CMP process.

Figure 6A:
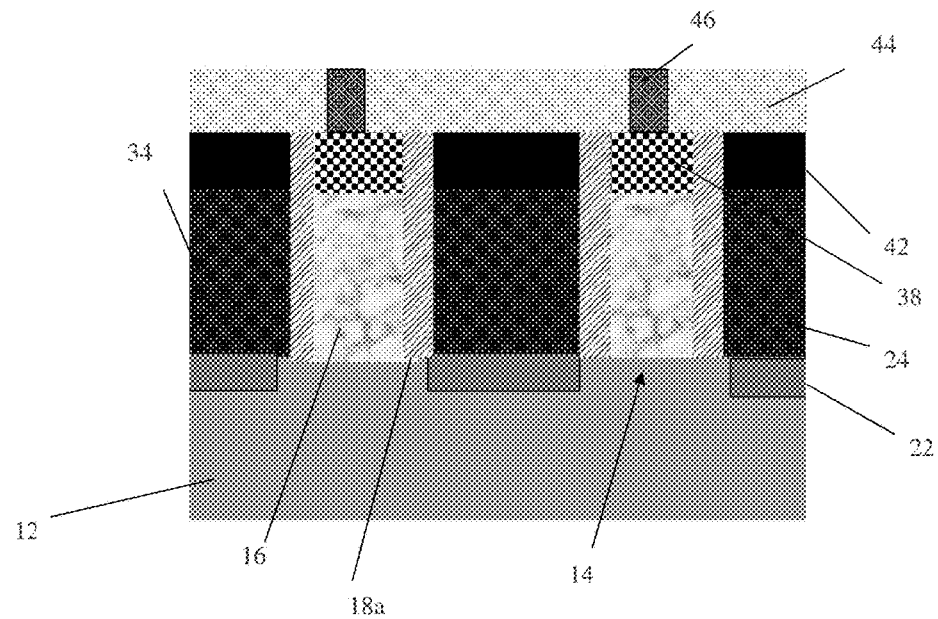
FIGS. 6A-6C show different cross-sectional views of a contact electrically contacting the second metal material over the source/drain regions, amongst other features, and respective fabrication processes in accordance with aspects of the present disclosure.
Figure 6B:
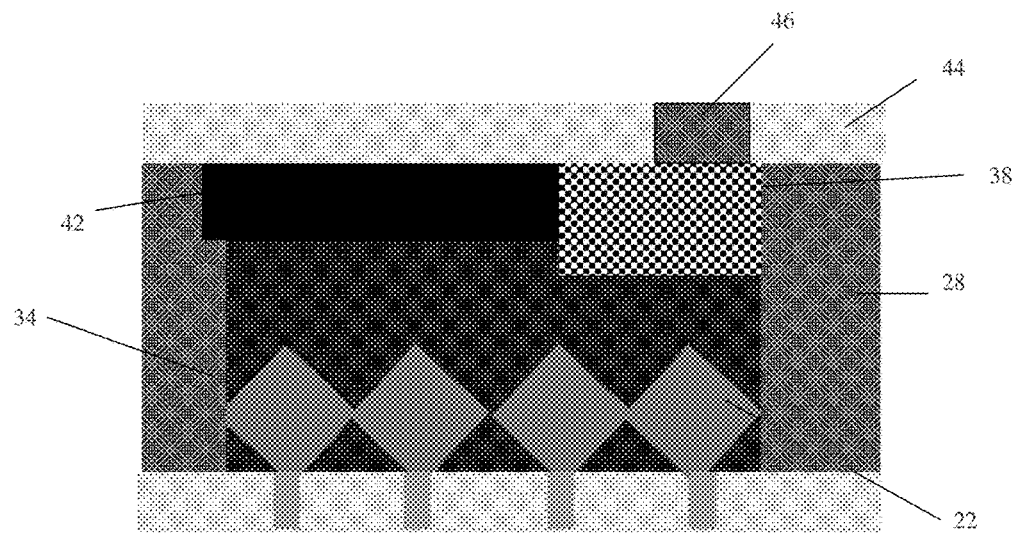
Figure 6C:
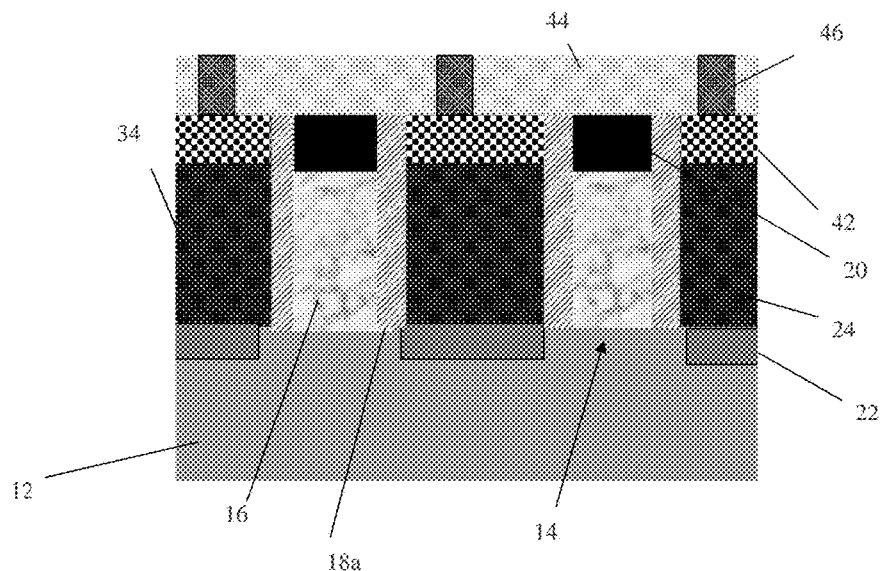

FIGS. 6A-6C show the contact formation, amongst other features, and respective fabrication processes. More specifically, a dielectric material 44 is deposited over the metal material 38 and the capping material 42. In embodiments, the dielectric material 44 is an interlevel dielectric material (e.g., oxide), deposited by conventional deposition processes such as CVD. An opening (trench) is formed in the dielectric material 44 aligned with the metal material 38 over both the source/drain region 22 and selected portions of the gate structure 14. During the etching process, the capping material 42 will protect the underlying metal material 34. In this way, when contact material 46 is deposited within the opening and in direct electrical contact with the metal material 38 it will not short to the metal material 34 of the source/drain region 22 (at selected regions). In embodiments, the contact material 46 is copper or other conductive metal material that forms a self-aligned contact with the metal material 38 (e.g., gate contact).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a gate structure having source and drain regions;
    a first metal material contacting the source and drain regions;
    a second metal material over the first metal material in the source and drain regions; and
    a capping material over the first metal material and over the gate structure;
    wherein the first metal material is different from the second metal material and the first metal material is Ru, Co or W.
2. The structure of claim 1, wherein the second metal material is another of Ru, Co or W.
3. The structure of claim 1, wherein the capping material is a same capping material over the first metal material and over metal material of the gate structure.
4. The structure of claim 3, wherein the capping material is a dielectric material.
5. The structure of claim 1, wherein the second metal material is directly contacting the first metal material and the capping material is adjacent to the second metal material.
6. The structure of claim 5, further comprising contacts for the source and drain regions, the contacts being in direct electrical connection with the second metal material.
7. The structure of claim 6, wherein the capping material protects the gate structure from electrically shorting to the source and drain regions by the contacts.
8. The structure of claim 7, further comprising a gate contact which is in direct electrical contact with the second metal material over the gate structure.
9. A structure comprising:
    source and drain regions of a gate structure comprising a first metal material and a second metal material;
    the gate structure comprising a metal gate material and the second metal material in contact with the metal gate material;
    a capping material over selected portions of the first metal material of the source drain regions and the metal gate material; and
    metal contacts contacting the second metal material in the source and drain regions and over the gate structure.
10. The structure of claim 9, wherein the first metal material is different from the second metal material.
11. The structure of claim 10, wherein the first metal material is Ru, Co or W and the second metal material is another of Ru, Co or W.
12. The structure of claim 9, wherein the capping material is a same capping material over the first metal material and over the metal gate material.
13. The structure of claim 9, wherein the second metal material is directly contacting the first metal material and the capping material is adjacent to the second metal material.
14. The structure of claim 9, wherein the capping material protects the gate structure from electrically shorting to the source and drain regions by the contacts.
15. A method, comprising:
    forming a first metal material over source and drain regions of a gate structure;
    forming a second metal material over the first metal material and over a gate metal of the gate structure;
    forming a capping material over selected portions of the first metal material of the source drain regions and the metal gate material; and
    forming metal contacts contacting the second metal material in the source and drain regions and over gate metal of the gate structure.
16. The method of claim 15, wherein the forming of the first metal material comprises removing amorphous material over the source drain regions with insulator material remaining above an opening formed by the removing and filling the space with the first metal material.
17. The method of claim 16, wherein the forming of the second metal material over the first metal material comprises removing the insulator material above the first metal material to form a trench and filling the trench with the second metal material.
18. The method of claim 17, further comprising recessing the first metal material over the source and drain regions and filling the recess with a capping material.

* * * * *